United States Patent [19]

Okumura

[11] Patent Number: 5,294,828
[45] Date of Patent: Mar. 15, 1994

[54] PLATE FOR SUPPORTING A PUNCHED LEADFRAME

[75] Inventor: Hiroshi Okumura, Kyoto, Japan

[73] Assignee: Rohm Co., Ltd., Kyoto, Japan

[21] Appl. No.: 31,131

[22] Filed: Mar. 12, 1993

[30] Foreign Application Priority Data

Mar. 17, 1992 [JP] Japan .................... 4-91943

[51] Int. Cl.⁵ ............ H01L 23/40; H01L 29/14; H01L 29/52; H01L 29/60
[52] U.S. Cl. ............... 257/676; 257/666; 257/706
[58] Field of Search ........... 257/676, 666, 739, 706, 257/720

[56] References Cited

U.S. PATENT DOCUMENTS 5,175,060 12/1992 Enomoto et al. ............ 257/676

FOREIGN PATENT DOCUMENTS 59-94853 5/1984 Japan ............ 257/676

Primary Examiner—Sheila V. Clark
Attorney, Agent, or Firm—William H. Eilberg

[57] ABSTRACT

A leadframe support plate, particularly a heater plate, for a wire bonding apparatus comprises a frame supporting face, and a die-pad supporting face for supporting a die pad of a leadframe. The die-pad supporting face is formed with at least one burr receiving groove extending along the marginal contour of the die pad, so that the die pad of the leadframe is supported stably on the die-pad supporting face even if the marginal of the die pad has burrs.

6 Claims, 7 Drawing Sheets

PLATE FOR SUPPORTING A PUNCHED LEADFRAME

BACKGROUND OF THE INVENTION

1. Field of the Invention

This invention relates to a wire bonding apparatus (wire bonder). More specifically, the present invention relates to a leadframe support plate, particularly a heater plate, for a wire bonding apparatus.

2. Description of the Prior Art

In manufacturing electronic components such as ICs, use is made of a leadframe which has a plurality of die pads at a constant pitch and a plurality of leads associated with each of the die pads. An electronic chip, generally called "die", is mounted on a corresponding die pad of the leadframe and electrically connected to the associated leads by wire bonding which is performed by using a wire bonder.

There are three methods for performing a wire bonding operation. A first method is the ultrasonic bonding in which a metal wire (made of gold or aluminum) is bonded to a chip electrode by application of ultrasonic energy. A second method is the thermo compression bonding wherein a metal wire is bonded to a chip electrode by application of thermal energy under a compressive force. A third method is the ultra thermo bonding which is the hybrid of the first and second methods. The present invention is applicable to either of these methods.

For conveniently explaining the problems to be solved by the present invention, reference is now made to FIGS. 8 through 15 of the accompanying drawings showing the prior art.

FIGS. 8 and 9 show a prior art heater plate as a typical example of leadframe support plate. The heater plate indicated by reference numeral 11 has a frame supporting face 12 and a die-pad receiving recess 13 which has a die-pad supporting face (bottom face) 13a lower than the frame supporting face. The heater plate is made of stainless steel for example and provided with an unillustrated heating means.

As shown in FIGS. 10 and 11, a leadframe L used for manufacturing electronic components has a plurality of die pads L1 (only one shown) arranged at a constant pitch, and a plurality of leads L2 surrounding each die pad. The leadframe may be made by punching a metal sheet, 0.1–0.25 mm in thickness, which is made of an iron-nickel alloy, a copper alloy, or other metal.

As shown in FIG. 11, the die pad L1 is located slightly lower than the plane of the leadframe L for carrying an IC chip D (die) as a typical example of electronic chip. The die-pad receiving recess 13 of the heater plate 11 is provided due to such an arrangement of the die pad L1.

In operation for die-bonding, a relevant portion of the leadframe L is first placed on the heater plate 11, and a presser plate P is pressed against the leadframe, as shown in FIGS. 12 and 13. In this state, the die pad L1 of the leadframe L is supported on the die-pad supporting face 13a of the heater plate, whereas the leads L2 are supported on the frame supporting face 12 of the heater plate under the pressure of the presser plate P.

Then, a capillary head C with a penetrating gold wire W having a ball end W1 is lowered and pressed axially against a selected electrode pad D1 of the IC chip D, as shown in FIGS. 14a and 14b. In the thermo compression bonding, the heater plate 11 imparts heat to the IC chip D. As a result, the axial compression force applied to the wire W together with the thermal energy provided by the heater plate 11 causes the wire ball end W1 to be bonded to the relevant electrode pad D1. In the ultra thermo bonding, the capillary head C is further subjected to ultrasonic vibration to increase the wire bonding strength.

Then, the capillary head C is raised and brought to a selected one of the leads L2 while allowing supply of the wire W, as shown in FIG. 14c. The wire can be bonded to the relevant lead L2 in the same manner as described above.

Finally, the capillary head C is raised without allowing supply of the wire W, thereby causing the wire to be pulled off. A new ball end W1 is formed by using a torch T for melting the wire endwise, as shown in FIG. 14d.

The same method steps are repeated for performing a wire bonding operation with respect to the other leads L2 of the leadframe.

The prior art heat plate 11 is acceptable if the leadframe is prepared by an etching method to have no marginal burr. In reality, however, a punching method is preferred for its lower cost and higher productivity, and it is inevitable in this case that the prepared leadframe will have marginal burrs B, as shown in FIG. 15.

When the prior art heater plate 11 is used for supporting the leadframe L having such marginal burrs B, the burrs cause the die pad L1 to be slightly lifted from the die-pad supporting face 13a, as shown in FIG. 16. Therefore, the support for the die pad L1 becomes unstable, and it is difficult in this condition to properly apply the axial compression force and/or the ultrasonic energy to the IC chip D, thus resulting in poor wire bonding (low bonding strength, distortion of the wire ball W1, and so on).

It should be appreciated that each lead L2 of the leadframe L also has marginal burrs. However, the burrs of the lead does not pose any problem for two reasons. First, the lead is subjected to a coining process (as required for plating) prior to performing a wire bonding operation, and this coining process serves to reduce the burrs to a certain degree. Secondly, the supporting stability for the lead L2 is ensured by the use of the presser plate P, so that the presence of the burrs may be ignored.

SUMMARY OF THE INVENTION

It is, therefore, an object of the present invention to provide a leadframe support plate, particularly a heater plate, which is capable of providing a stable support for a die pad of a leadframe even if the die pad has marginal burrs, thereby improving the wire bonding performance of the relevant wire bonder.

Another object of the present invention is to make such a plate applicable to different leadframes having differently sized die pads.

According to the present invention, there is provided a leadframe support plate, particularly a heater plate for a wire bonding apparatus comprising a frame supporting face, and a die-pad supporting face for supporting a die pad of a leadframe, the die pad having a marginal contour, wherein the die-pad supporting face is formed with at least one burr receiving groove extending along the marginal contour of the die pad.

With the arrangement described above, since the marginal burrs of the die pad can be received in the burr receiving groove, the presence of the burrs does not cause lifting of the die pad from the die-pad supporting face of the heater plate. Thus, the die pad can be stably supported on the die-pad supporting face during a wire bonding operation, so that the supersonic energy and/or axial compressive energy applied to the ball end of a wire for wiring bonding can be reliably transmitted to the electronic chip (die) bonded to the die pad. As a result, the bonded ball end is made to have a predetermined shape and a uniform bonding strength.

Preferably, the leadframe support plate should further comprise a die-pad receiving recess surrounded by the frame supporting face. In this case, the bottom face of the die-pad receiving recess serves as the die-pad supporting face.

The die-pad receiving recess may have side walls spaced from the burr receiving groove. Alternatively, the width of the burr receiving groove may be increased to such an extent that the side walls of the die-pad receiving recess partially define the burr receiving groove. In the latter case, the size of the die pad may be increased or decreased as long as the marginal burrs of the die pad can be fully received in the burr receiving groove.

Further, the die-pad supporting face is formed with a plurality of burr receiving grooves which are differently sized to be arranged one within another. In this case, also, the size of the die pad may be increased or decreased as long as the marginal burrs of the die pad can be fully received in a selected one of the burr receiving grooves.

Other objects, features and advantages of the present invention will become apparent from the following detailed description of the preferred embodiments given with reference to the accompanying drawings.

BRIEF DESCRIPTION OF THE DRAWINGS

In the accompanying drawings:

FIGS. 14a-14d are fragmentary sectional views showing the successive steps of performing a wire bonding operation by using the prior art heater plate;

DETAILED DESCRIPTION OF THE PREFERRED EMBODIMENTS

In the following description, a heater plate is taken up as a typical example of leadframe support plate incorporated in a wire bonder. However, the present invention is equally applicable to any leadframe support plate as long as it is used for supporting a leadframe at the time of performing a wire bonding operation.

Figure 1:
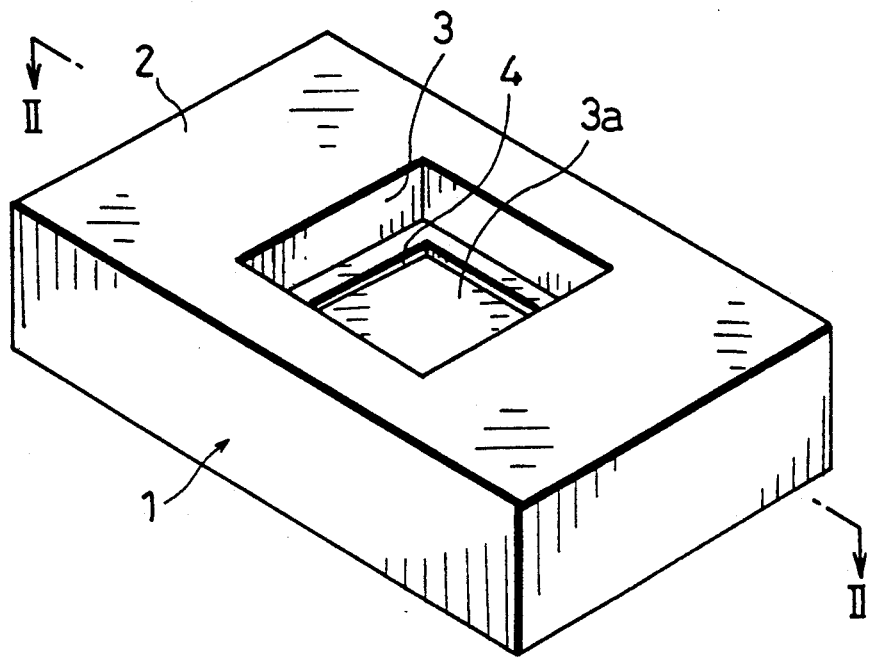
FIG. 1 is a perspective view showing a heater plate according to the present invention.
Figure 2:
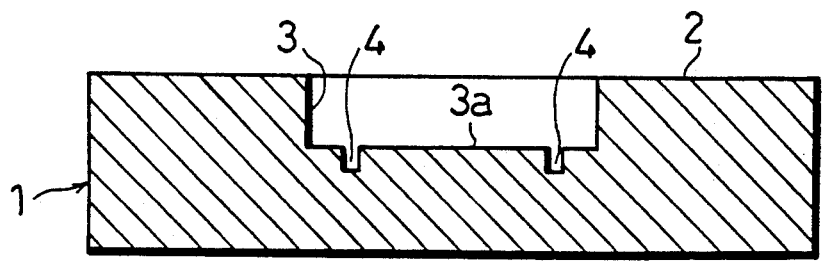
FIG. 2 is a sectional view taken along lines II—II in FIG. 1.

Referring first to FIGS. 1 and 2 of the accompanying drawings, there is shown a heater plate 1 of a wire bonder according to a first embodiment of the present invention. Similarly to the prior art arrangement, the heater plate has a frame supporting face 2 and a die-pad receiving recess 3 which has a die-pad supporting face (bottom face) 3a lower than the frame supporting face. The heater plate is provided with an unillustrated heating means.

The heater plate 1 of the present invention, which may be made of stainless steel for example, is used for performing a wire bonding operation with respect to a conventional leadframe which has the same configuration as the one already described with reference to FIGS. 10 and 11. Thus, to avoid duplicated explanation, the configuration of the leadframe L itself is not described here.

Figure 10:
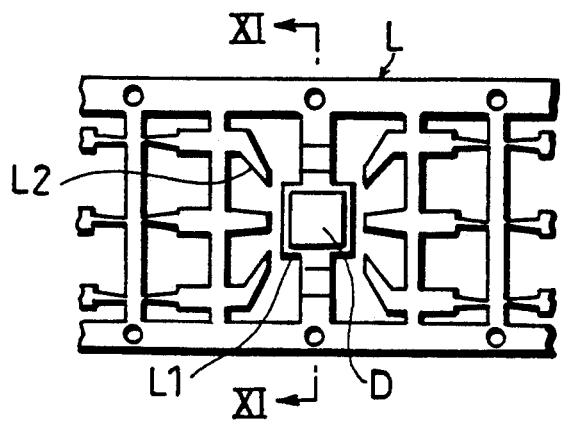
FIG. 10 is a plan view showing a prior art leadframe.
Figure 11:
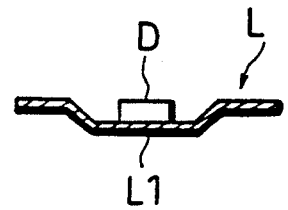
FIG. 11 is a sectional view taken along lines XI—XI in FIG. 10.
Figure 12:
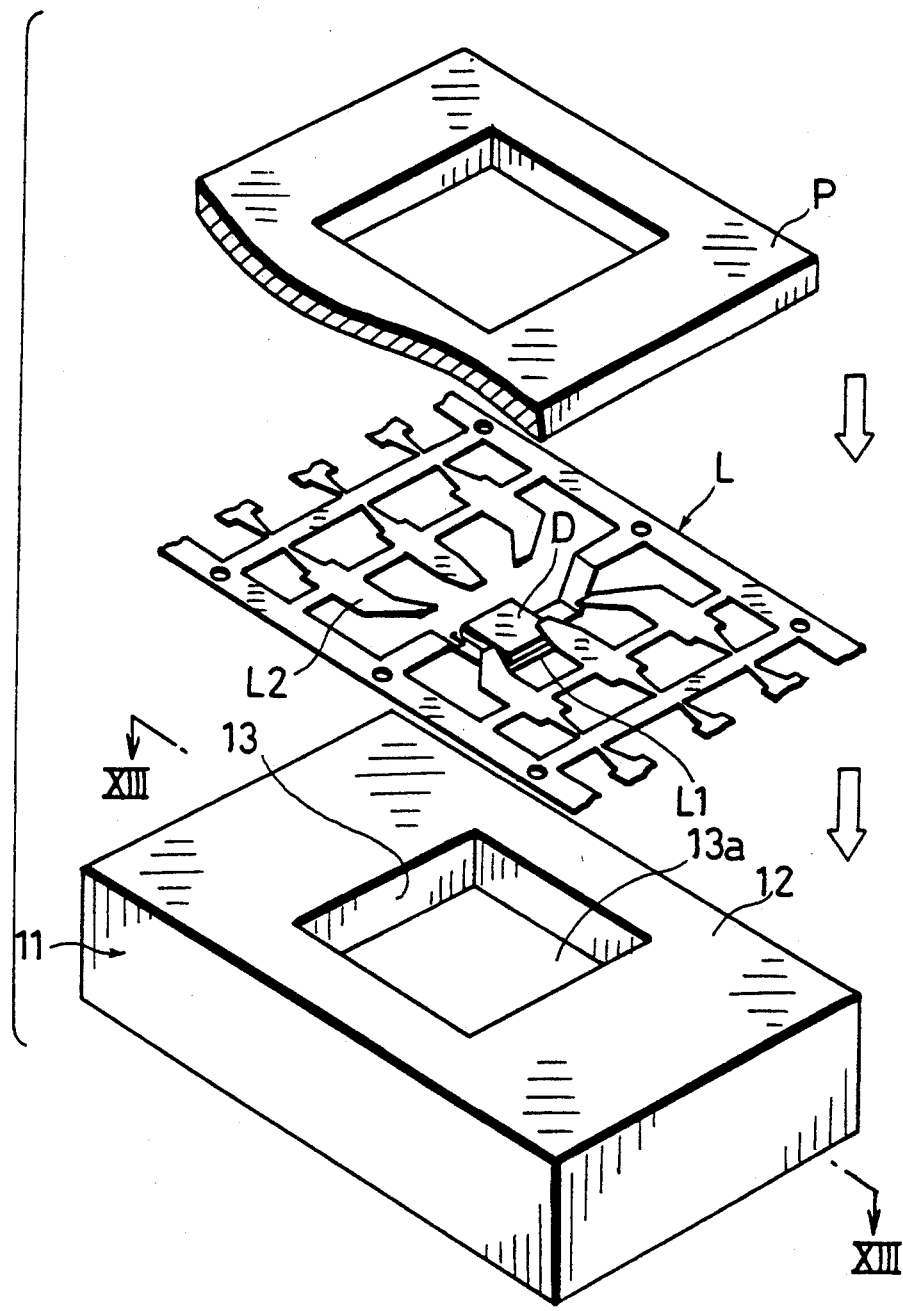
FIG. 12 is a perspective view showing a method step of placing the leadframe on the prior art heater plate.
Figure 13:
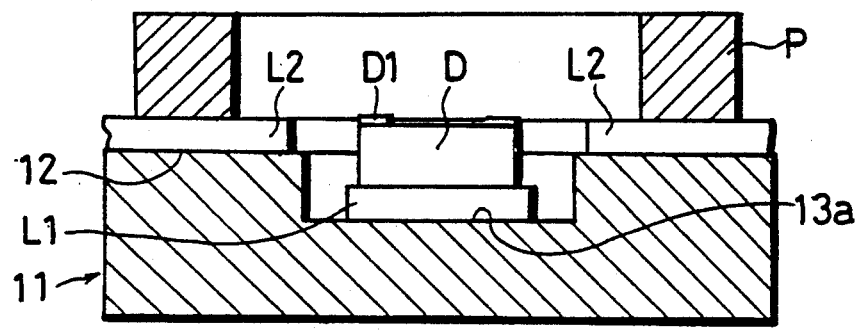
FIG. 13 is a sectional view taken along lines XIII—XIII in FIG. 12 for showing the condition after placement of the leadframe.
Figure 13:
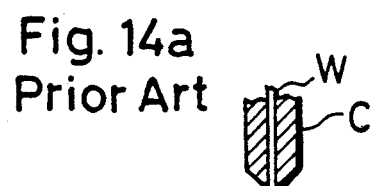
Figure 14B:
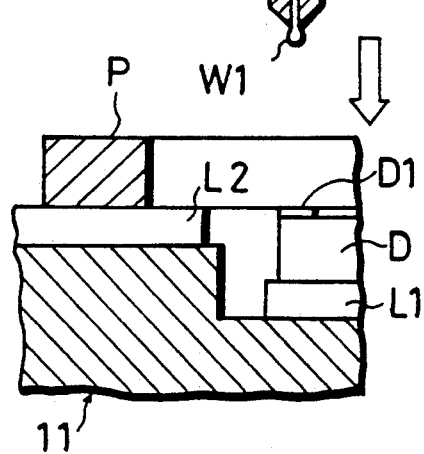
Figure 14B:
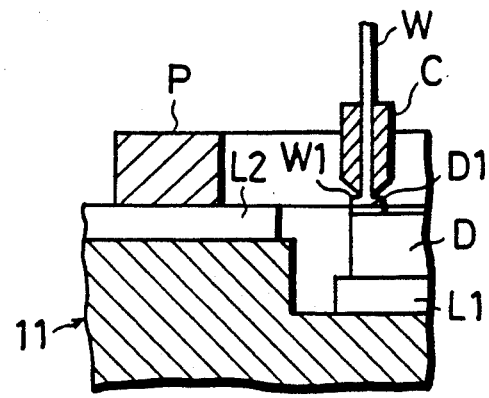
Figure 14C:
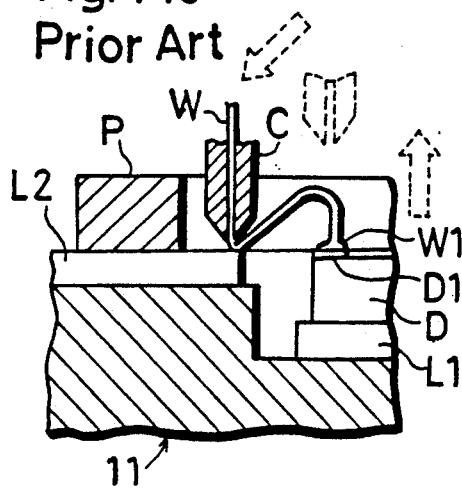
Figure 14D:
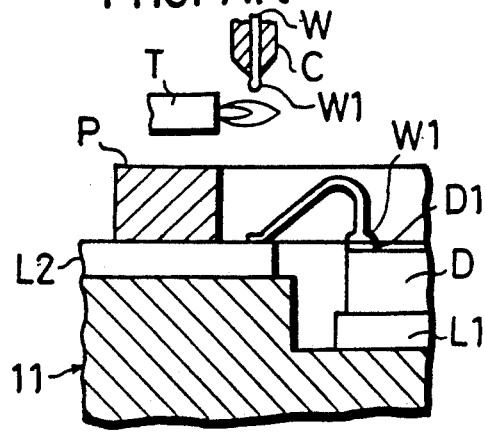
Figure 15:
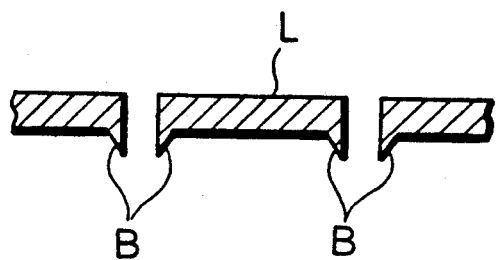
FIG. 15 is a fragmentary schematic sectional view showing the leadframe with burrs.
Figure 16:
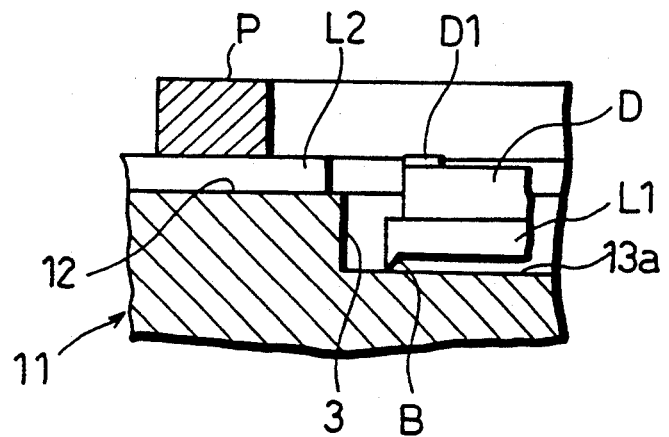
FIG. 16 is a fragmentary sectional view illustrating how the burrs cause problems in wire bonding.

According to the present invention, the die-pad supporting face 3a of the recess 3 is formed with a burr receiving groove 4 extending along a rectangle which generally corresponds to the marginal contour of the die pad L1 of the leadframe L (see FIGS. 10 and 11). The groove 4 needs to have a sufficient width and depth for fully receiving the burrs B (see FIG. 3) of the leadframe. Usually, the width and depth of the groove 4 may be respectively about 0.1 mm.

Figure 3:
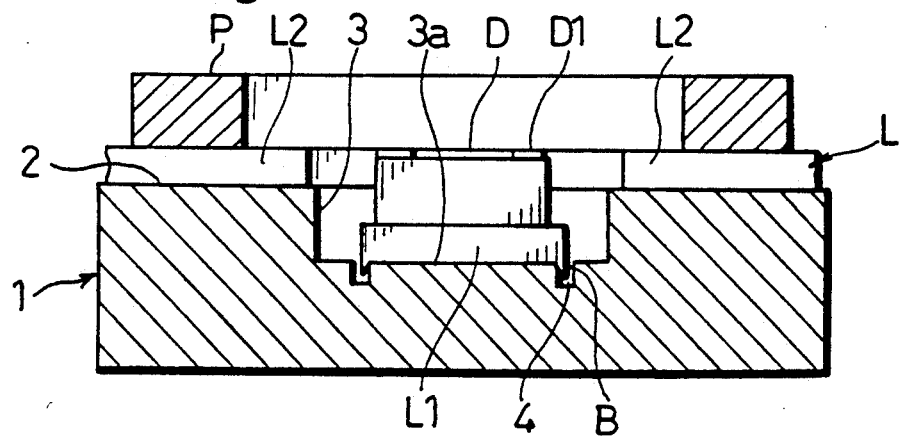
FIGS. 3 and 4 are sectional views showing the successive steps of performing a wire bonding operation using the heater plate shown in FIGS. 1 and 2.

In operation for die-bonding, a relevant portion of the leadframe L is first placed on the heater plate 1, and a presser plate P is pressed against the leadframe, as shown in FIG. 3. The die pad L1 of the leadframe L, which carries a previously bonded IC chip (die) D, is supported on the die-pad supporting face 3a of the heater plate, whereas the leads L2 are supported on the frame supporting face 2 of the heater plate under the pressure of the presser plate P. In this condition, the burrs B of the die pad L1 are fully received in the groove 4 of the heater plate without causing lifting from the die-pad supporting face 3a, so that the die-pad supporting face can provide a stable support for the die pad.

Figure 4:
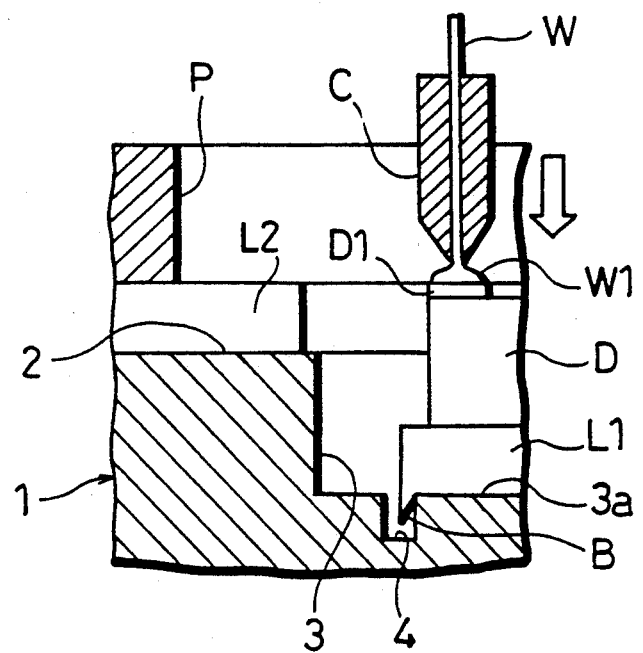

Then, a capillary head C with a penetrating gold wire W having a ball end W1 is lowered and axially pressed against a selected electrode pad D1 of the IC chip D, as shown in FIG. 4. Similarly to the prior art, the head C is subjected to supersonic application while the heater plate 1 is heated. The applied supersonic energy combined with the axial compression energy and the heat energy causes the wire ball end W1 to be fixedly bonded to the electrode pad D1. At this time, since the groove 4 of the heater plate insures intimate supporting contact (non-lifting contact) between the die-pad supporting face 3a and the die pad L1 despite the presence of the burrs B, the supersonic energy and the axial compression force can be always applied stably to the IC chip D to enable proper wire bonding.

The subsequent steps of wire bonding can be performed in the same manner as already described for the prior art with reference to FIGS. 14a-14d.

Figure 5:
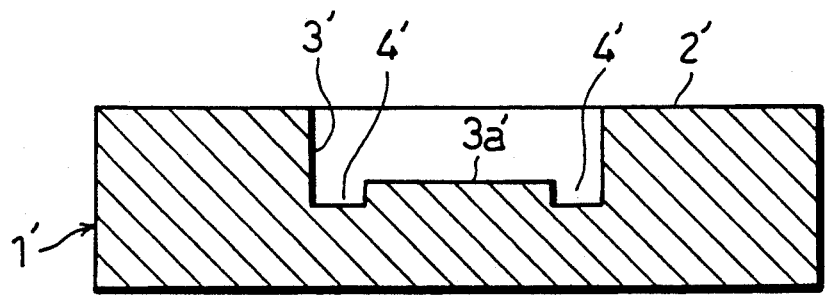
FIG. 5 is a sectional view similar to FIG. 2 but showing another heater plate according to the present invention.

FIG. 5 shows a heater plate 1' according to a second embodiment of the present invention. Similarly to the foregoing embodiment, this heater plate has a frame supporting face 2', a die-pad receiving recess 3' having a die-pad supporting face 3a' (bottom face), and a burr receiving groove 4' formed in the die-pad supporting face.

The heater plate 1' of the second embodiment differs from that of the first embodiment in that the burr receiving groove 4' is partially defined by the side walls of the die-pad receiving recess 3' for increasing the width of the groove. Obviously, the increased width of the groove 4 allows for size variations of the die pad L1 (see FIG. 3).

Figure 6:
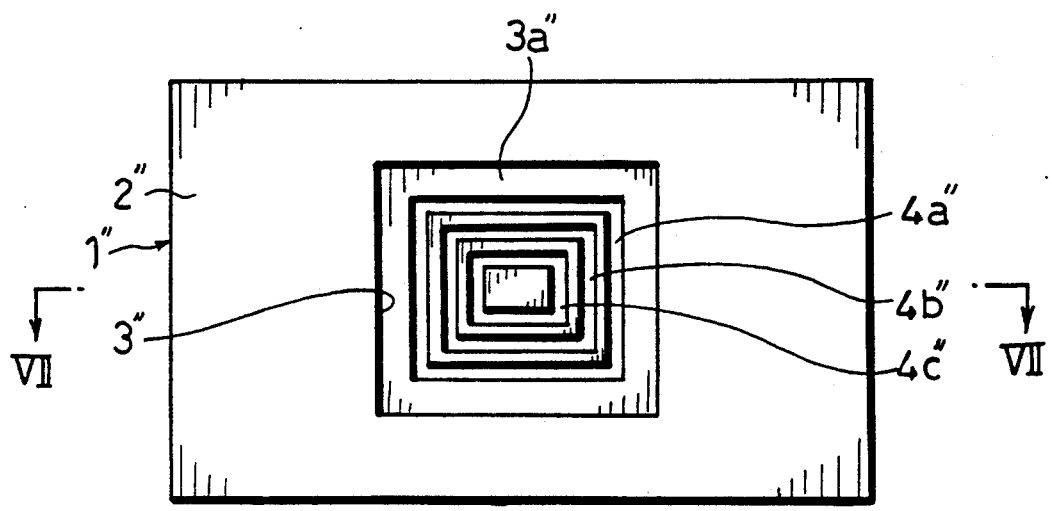
FIG. 6 is a plan view showing a further heater plate according to the present invention.
Figure 7:
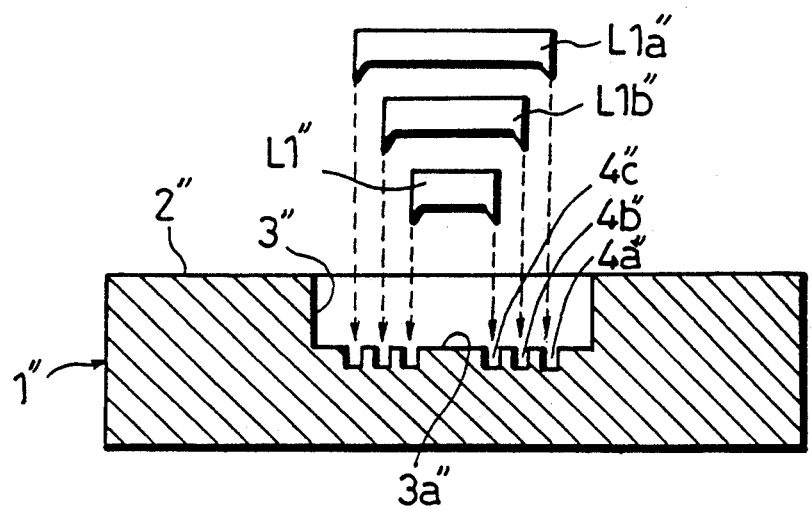
FIG. 7 is a sectional view taken along lines VII—VII in FIG. 6.
Figure 8:
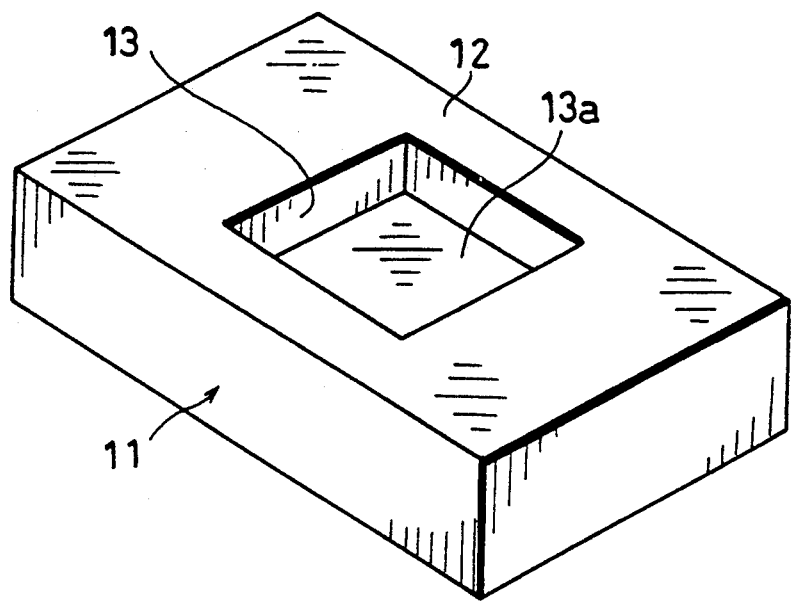
FIG. 8 is a perspective view showing a prior art heater plate.
Figure 9:
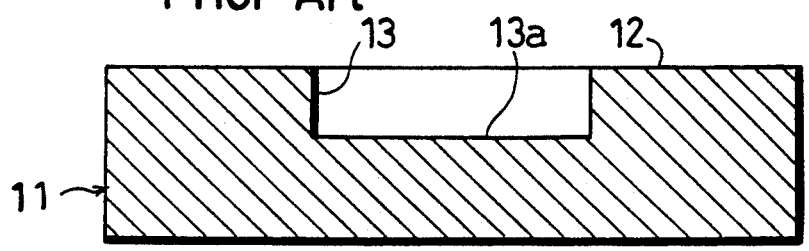
FIG. 9 is a sectional view taken along lines IX—IX in FIG. 8.

FIGS. 6 and 7 show a heater plate 1'' according to a third embodiment of the present invention. Similarly to the foregoing embodiments, this heater plate has a frame supporting face 2'', and a die-pad receiving recess 3'' having a die-pad supporting face 3a''. However, the die-pad supporting face 3a'' formed with a plurality of burr receiving grooves 4a'', 4b'', 4c'' which are differently sized for suitably supporting a selected one of differently sized die pads L1a'', L1b'', L1c'' (see FIG. 7).

The present invention being thus described, it is obvious that the same may be varied in many ways. For instance, the die-pad supporting face 3a (or 3a' or 3a'') may be formed at the same level as the frame supporting face 2 (or 2' or 2'') if the die pad L1 is contained in the plane of the leadframe L. Further, the leadframe support plate 1 (or 1' or 1'') need not have any heating function in case the leadframe support plate is used only for the ultrasonic wire bonding. Such variations are not to be regarded as a departure from the spirit and scope of the invention, and all such modifications as would be obvious to those skilled in the art are intended to be included within the scope of the following claims.

I claim:

1. A leadframe support plate for directly supporting a punched leadframe at the time of wire bonding, the support plate comprising a frame supporting face, and a die-pad supporting face for supporting a die pad of the leadframe, the die pad having marginal burrs along a marginal contour of the die pad,
   wherein the die-pad supporting face is formed with at least one burr receiving groove extending along the marginal contour of the die pad for receiving the marginal burrs.

2. The leadframe support plate according to claim 1, further comprising a die-pad receiving recess surrounded by the frame supporting face, the die-pad receiving recess has a bottom face serving as the die-pad supporting face.

3. The leadframe support plate according to claim 2, wherein the die-pad receiving recess has side walls spaced from the burr receiving groove.

4. The leadframe support plate according to claim 2, wherein the die-pad receiving recess has side walls partially defining the burr receiving groove.

5. The leadframe support plate according to claim 1, wherein the die-pad supporting face is formed with a plurality of burr receiving grooves which are differently sized to be arranged one within another.

6. A heater plate for directly supporting a punched leadframe at the time of wire bonding while also heating the leadframe, the heater plate comprising a frame supporting face, and a die-pad supporting face for supporting a die pad of the leadframe, the die pad having marginal burrs along a marginal contour of the die pad,
   wherein the die-pad supporting face is formed with at least one burr receiving groove extending along the marginal contour of the die pad for receiving the marginal burrs.

* * * * *